US008663440B2

(12) United States Patent
Tsukamoto et al.

(10) Patent No.: US 8,663,440 B2
(45) Date of Patent: Mar. 4, 2014

(54) TITANIUM TARGET FOR SPUTTERING

(75) Inventors: Shiro Tsukamoto, Ibaraki (JP); Tomio Otsuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 325 days.

(21) Appl. No.: 12/892,018

(22) Filed: Sep. 28, 2010

(65) Prior Publication Data

US 2012/0073964 A1 Mar. 29, 2012

(51) Int. Cl.
*C25B 9/00* (2006.01)
*C23C 14/00* (2006.01)
*C25B 11/00* (2006.01)
*C25B 13/00* (2006.01)
*C04B 35/00* (2006.01)
*H01B 1/02* (2006.01)
*C01B 33/20* (2006.01)
*C01G 25/02* (2006.01)
*C01G 27/02* (2006.01)

(52) U.S. Cl.
USPC .......... 204/298.13; 204/298.12; 252/62.9 PZ; 252/519.12; 252/520.2; 423/326; 423/608

(58) Field of Classification Search
USPC ................. 204/298.12, 298.13; 252/62.9 PZ, 252/519.12, 520.2; 423/326, 608
See application file for complete search history.

(56) References Cited

U.S. PATENT DOCUMENTS

| 5,798,005 | A | * | 8/1998 | Murata et al. ............... 148/421 |
| 5,993,621 | A | | 11/1999 | Liu |
| 6,302,977 | B1 | | 10/2001 | Liu |
| 6,509,102 | B1 | | 1/2003 | Liu |
| 6,755,948 | B1 | | 6/2004 | Fukuyo et al. |
| 2005/0076811 | A1 | * | 4/2005 | Kayama et al. ............... 106/437 |
| 2006/0074173 | A1 | * | 4/2006 | Kogoi et al. ............... 524/497 |
| 2007/0108043 | A1 | * | 5/2007 | Lu ............... 204/192.15 |
| 2007/0251819 | A1 | * | 11/2007 | Kardokus et al. ........ 204/298.13 |

FOREIGN PATENT DOCUMENTS

JP 05214519 A * 8/1993

* cited by examiner

*Primary Examiner* — Michael Band
(74) *Attorney, Agent, or Firm* — Howson & Howson LLP

(57) ABSTRACT

The object of this invention is to provide a high quality titanium target for sputtering capable of reducing the impurities that cause generation of particles and abnormal discharge, which is free from fractures and cracks during high power sputtering (high rate sputtering), and capable of stabilizing the sputtering properties and effectively suppressing the generation of particles upon deposition. This invention is able to solve foregoing problems using a high purity titanium target for sputtering containing, as additive components, 3 to 10 mass ppm of S and 0.5 to 3 mass ppm of Si, and in which the purity of the target excluding additive components and gas components is 99.995 mass percent or higher.

9 Claims, No Drawings

TITANIUM TARGET FOR SPUTTERING

TECHNICAL FIELD

The present invention relates to a high-quality titanium target for sputtering capable of reducing the impurities contained in the titanium target for sputtering, which is free from fractures and cracks during high power sputtering (high rate sputtering), and capable of stabilizing the sputtering properties and effectively suppressing the generation of particles upon deposition.

The impurity concentration described in the present specification will be displayed in mass percent (mass %) in all cases.

BACKGROUND ART

In recent years, various electronic devices have been devised beginning with the exponential advancement of semiconductors, and the improvement of the performance thereof as well as the development of new devices are being sought on a daily basis.

Under these circumstances, there is an inclination toward the miniaturization of electronic devices and equipment and increase in the degree of integration thereof. Numerous thin films are formed in the manufacturing process of many of such devices and equipment, and titanium, from its unique metallic property, is used in the formation of thin films of various electronic devices as titanium and its alloy film, titanium silicide film, titanium nitride film or the like.

Upon forming such thin films of titanium (including alloys and compounds thereof), attention must be given to the fact that the titanium film itself requires a high degree of purity.

The thin films used in semiconductors and the like are made even thinner, shorter and smaller, and, since the mutual distance thereof is extremely small and the integration density is being improved, there is a problem in that the substance forming the thin film or the impurities contained in such thin film will diffuse to the adjacent thin films. This will result in the off-balance of the constituents of the original film and the adjacent films, and there is a significant problem in that the primary function of the film will deteriorate.

In the manufacturing process of this type of thin film, there are cases where the application of heat reaches several hundred degrees, and the temperature also rises during the use of electronic devices equipped with semiconductor devices. This kind of rise in temperature further increases the diffusion rate of the aforementioned substances, and will result in a significant problem where the functions of the electronic devices will deteriorate. Moreover, generally speaking, the aforementioned titanium and its alloy film, titanium silicide film or titanium nitride film can be formed with a physical deposition method such as sputtering or vacuum deposition. Explained below is the sputtering method which is used most comprehensively among the above.

This sputtering method is a method of physically colliding positive ions such as $Ar^+$ to a target disposed on a cathode and releasing the metal atoms structuring the target with the collision energy thereof. Nitrides can be formed by using titanium or its alloy (TiAl alloy, etc.) as the target and conducting sputtering under a mixed gas atmosphere of argon gas and nitrogen.

When impurities exist in the titanium (including alloys and compounds thereof) target upon forming this sputtering film, coarsened particles floating in the sputtering chamber adhere to the substrate and cause the disconnection or short circuit of the thin film circuit, and increase the amount of generated particles that cause protrusions on the thin films. Thus, there is a problem in that a uniform film cannot be formed.

Due to the foregoing problems, it goes without saying that it has been a need to reduce impurities such as transition metals, high melting point metals, alkali metals, alkali earth metals and other metals. Nevertheless, the aforementioned particles are formed even when decreasing the elements thereof as much as possible and the current status is that the fundamental solution for the foregoing problems is yet to be found.

Furthermore, although there are cases where the titanium thin film is used as a pasting layer for preventing the generation of particles upon forming a titanium nitride Ti—N film, the film is hard and sufficient adhesive strength could not be obtained, nor would it function as a pasting layer since it would peel off from the inner wall of the film-forming device or its components. Thus, there is a problem in that this would cause the generation of particles.

Moreover, in recent years, in order to improve the production efficiency, there are demands for high rate sputtering (high power sputtering). Here, there are cases where the target is subject to fractures or cracks, and these problems tend to prevent stable sputtering. Patent Documents 1 and Patent Documents 2 listed below are cited as prior art documents.

[Patent Documents 1] International Publication No. WO01/038598

[Patent Documents 2] Japanese Translation of PCT International Application Publication No. 2001-509548

DISCLOSURE OF INVENTION

The present invention was devised in order to resolve the various problems described above. Thus, an object of this invention is to provide a high quality titanium target for sputtering capable of reducing the impurities that cause generation of particles and abnormal discharge, which is free from fractures and cracks during high power sputtering (high rate sputtering), and capable of stabilizing the sputtering properties and effectively suppressing the generation of particles upon deposition.

The present invention provides 1) a high purity titanium target for sputtering containing, as additive components, 3 to 10 mass ppm of S and 0.5 to 3 mass ppm of Si, and in which the purity of the target excluding additive components and gas components is 99.995 mass percent or higher.

The present invention additionally provides 2) the titanium target for sputtering according to 1) above, wherein the purity excluding additive components and gas components is 99.999 mass percent or higher; 3) the titanium target for sputtering according to 1) or 2) above, wherein the average crystal grain size of the target is 20 μm or less; and 4) the titanium target for sputtering according to any one of 1) to 3) above, wherein the average crystal grain size of the target prior to performing sputtering is 20 μm or less, and the average crystal grain size after starting the sputtering process is 70 μm or less.

EFFECT OF THE INVENTION

The titanium target for sputtering of the present invention yields a superior effect in that it is capable of inhibiting the generation of particles and abnormal discharge by reducing the impurities in the target, is free from fractures and cracks even during high power sputtering (high rate sputtering), and capable of stabilizing the sputtering properties and forming a high quality film.

BEST MODE FOR CARRYING OUT THE INVENTION

The titanium target for sputtering of the present invention is a high purity target having a purity of 99.995 mass percent or higher, and more preferably 99.999 mass percent or higher. It goes without saying that the purity of the foregoing titanium target excludes additive components and gas components.

Generally speaking, a certain level of gas components such as oxygen, nitrogen and hydrogen get included in greater amounts in comparison to other impurity elements. Although the amount of inclusion of these gas components is desirably small, an amount that is normally included will not be particularly harmful in achieving the object of the present invention.

The inclusion of 3 to 10 mass ppm of S and 0.5 to 3 mass ppm of Si as additive components is a significant feature of the present invention. By adding foregoing S and Si, the average crystal grain size of the target can be made to be 20 µm or less at the stage of producing the target.

Moreover, the target is heated to approximately 700° C. in the sputtering process, but the addition of S and Si also inhibits the coarsening of the crystal grain size resulting from the heating process. Specifically, it is possible to maintain an average crystal grain size of 70 µm or less even upon being subject to this kind of high temperature heat; that is, the average crystal grain size of the target can be maintained to be 70 µm or less even upon being subject to this kind of heat treatment after the sputtering of the target is started.

Heat during the sputtering also affects the crystal plane orientation. Nevertheless, the addition of foregoing S and Si yields the effect of effectively inhibiting changes in the crystal plane orientation. Changes in the crystal plane orientation is undesirable since it will affect the deposition rate and film quality, and the inhibition of changes in the crystal plane orientation yields the effect of maintaining constant deposition quality.

Moreover, as shown in the Examples described later, although there is not much change in the strength, increase in elongation is acknowledged. This yields a significant effect of inhibiting the generation of fractures and cracks in the target.

In the foregoing case, although this is affected by the crystal grain size of the target before starting the sputtering process and by the slightly coarsened crystal grain size due to the thermal effect after the sputtering is started as described above, the strength is high in both cases and will not change considerably. Meanwhile, there is a significant feature in that the increase in elongation is acknowledged.

A target with high strength and large elongation yields the effect of inhibiting the generation of fractures and cracks in the target. In addition, this phenomenon yields the effect of inhibiting the generation of fractures and cracks in the target not only in the target before starting the sputtering process, but also in the target that is subject to the high temperature thermal effect of 700° C. in the sputtering process.

Together with the progress of the sputtering process, the generation of particles will gradually increase. Conventionally, the crystal grain size tended to coarsen, but the present invention is able to limit the coarsening to 70 µm or less as described above, and the prevention of coarsening of the crystal grain size is effective in preventing the generation of particles.

In addition, since the crystal orientation is stabilized, it is possible to obtain stable sputtering properties, which is effective to realize uniform deposition.

Moreover, since the target shows high strength and high elongation even upon being subject to the thermal effect, it is possible to reduce the stress on the target surface due to the warping during sputtering or the thermal stress or thermal fatigue caused by the ON/OFF of the sputtering power, and it is thereby possible to effectively prevent the target from cracking.

The foregoing effects can be achieved as a result of the titanium target itself being high purity and containing, as additive components, 3 to 10 mass ppm of S and 0.5 to 3 mass ppm of Si, and these numerical ranges show the range that the effectiveness of the present invention can be realized.

The object of the present invention cannot be achieved if it is less than the lower limit and the properties as a high purity target will be impaired and become impurities if it exceeds the upper limit. Thus, the foregoing range is used.

In manufacturing a high purity target, the well-known molten salt electrolysis may be used. The atmosphere is preferably an inert atmosphere. During electrolysis, the initial cathode current density is set to 0.6 A/cm$^2$ or less as the lower current density. Moreover, the electrolytic temperature is preferably set to 600 to 800° C.

The electrodeposited Ti obtained as described above and the foregoing additive elements; namely, 3 to 10 mass ppm of S and 0.5 to 3 mass ppm of Si, are mixed and subject to EB (electron beam) melting, additionally subject to cold solidification to prepare an ingot, and this is subject to hot deformation work such as hot forging or hot extrusion at 800 to 950° C. to prepare a billet. The billet is further processed to destroy the uneven and coarsened cast structure of the ingot to obtain a uniform and fine structure.

Cold plastic deformation such as cold forging or cold extrusion was repeatedly performed to the billet obtained as described above to apply high strain to the billet, and the crystal structure of the target was ultimately made to be a uniform fine structure of 20 µm or less.

Subsequently, the billet was cut to prepare a preform corresponding to the target volume. Cold plastic working such as cold forging or cold extrusion was additionally performed to the preform to apply high stress, and process this into a disk-shaped target.

In addition, the target comprising a processed structure accumulated with high strain was subject to a rapid temperature rise using a fluid bed furnace or the like, and heat treatment was performed for a short period of time at 400 to 500° C. It is thereby possible to obtain a target having a fine recrystallized structure of 20 µm or less.

The foregoing manufacturing processes show an example of a method for obtaining the high purity target of the present invention, and the present invention is not limited to the foregoing manufacturing processes so as long as it is possible to obtain a titanium target for sputtering containing 3 to 10 mass ppm of S and 0.5 to 3 mass ppm of Si in which the remainder is titanium and unavoidable impurities, and in which the purity of the target excluding additive components and gas components is 99.995 mass percent or higher.

EXAMPLES

Examples of the present invention are now explained. Note that these Examples are merely exemplifications and the present invention shall not be limited thereto. Specifically, the present invention covers all modes or modifications other than the Examples included in the scope of technical concept of the present invention.

Examples 1 to 5

S+Si were added to Ti having a purity of 99.995 mass percent as follows.
(Example 1) 3 mass ppm of S and 3 mass ppm of Si
(Example 2) 5 mass ppm of S and 2 mass ppm of Si
(Example 3) 7 mass ppm of S and 1 mass ppm of Si
(Example 4) 10 mass ppm of S and 0.5 mass ppm of Si Comparative Examples 1 and 2

S+Si were added to Ti having a purity of 99.995 mass percent as follows.
(Comparative Example 1) 0.5 mass ppm of S (this does not satisfy the condition of the present invention) and 2 mass ppm of Si
(Comparative Example 2) 5 mass ppm of S and 0.3 mass ppm of Si (this does not satisfy the condition of the present invention)

Ti added with the elements shown in foregoing Examples 1 to 5 and Comparative Examples 1 and 2 was subject to electron beam melting, the aforementioned production conditions were used as needed to prepare a Ti ingot, and this was processed into a target shape. The obtained target was heated to 550° C. and 700° C. and the growth of the crystal grains was observed. Results of the crystal grain size during the target preparation and the crystal grain size after the heating process are shown in Table 1. Examples 1 to 5 and Comparative Examples 1 and 2 all had fine crystals of 20 μm or less at the stage of preparing the target.

At the stage of producing the Ti ingot of the present invention, since there is segregation of components at the top part and the bottom part, such components were analyzed regarding Example 5. The results are shown in Table 2 and Table 3. Table 2 is the top part and Table 3 is the bottom part.

In the foregoing case, the top part and the bottom part were both within the scope of additive components of the present invention even though there are differences with the additive components. If there is a considerable difference between the top part and the bottom part, it goes without saying that the portion to be acquired from the ingot can be used by being suitably selected (that is, eliminating the inappropriate area).

TABLE 1

| | S amount | Si amount | GS during target preparation | GS upon heating to 550° C. | GS upon heating to 700° C. |
|---|---|---|---|---|---|
| Example 1 | 3 | 3 | 6 | 8 | 45 |
| Example 2 | 5 | 2 | 5 | 10 | 50 |
| Example 3 | 7 | 1 | 5 | 9 | 44 |
| Example 4 | 10 | 0.5 | 5 | 8 | 48 |
| Comparative Example 1 | 0.5 | 2 | 8 | 30 | 180 |
| Comparative Example 2 | 5 | 0.3 | 8 | 23 | 110 |

GS: (average crystal grain size)
S amount and Si amount respectively show the additive amount (mass ppm).

TABLE 2

| Element | Concentration [ppm wt] | Element | Concentration [ppm wt] |
|---|---|---|---|
| Li | <0.005 | Ag | <0.02 |
| Be | <0.005 | Cd | <0.05 |
| B | <0.01 | In | <0.05 |
| F | <0.05 | Sn | <0.05 |
| Na | <0.01 | Sb | <0.05 |
| Mg | 0.02 | Te | <0.05 |
| Al | 0.24 | I | <0.01 |
| Si | 1.08 | Cs | <0.01 |
| P | <0.01 | Ba | <0.005 |
| S | 4.81 | La | <0.005 |
| Cl | 0.35 | Ce | <0.005 |
| K | <0.01 | Pr | <0.005 |
| Ca | <0.2 | Nd | <0.005 |
| Sc | <0.05 | Sm | <0.005 |
| Ti | Matrix | Eu | <0.005 |
| V | <0.005 | Gd | <0.005 |
| Cr | 4.75 | Tb | <0.005 |
| Mn | 0.12 | Dy | <0.005 |
| Fe | 0.33 | Ho | <0.005 |
| Co | 0.02 | Er | <0.005 |
| Ni | 0.22 | Tm | <0.005 |
| Cu | 0.7 | Yb | <0.005 |
| Zn | <0.05 | Lu | <0.005 |
| Ga | <0.05 | Hf | 0.09 |
| Ge | <0.05 | Ta | <5 |
| As | <0.01 | W | <0.01 |
| Se | <0.05 | Re | <0.01 |
| Br | <0.05 | Os | <0.01 |
| Rb | <5 | Ir | <0.01 |
| Sr | <3000 | Pt | <0.05 |
| Y | <200 | Au | <0.05 |
| Zr | 0.55 | Hg | <0.1 |
| Nb | <0.2 | Tl | <0.01 |
| Mo | <0.05 | Pb | <0.01 |
| Ru | <0.01 | Bi | <0.01 |
| Rh | <0.05 | Th | <0.0001 |
| Pd | <0.01 | U | <0.0001 |

TABLE 3

| Element | Concentration [ppm wt] | Element | Concentration [ppm wt] |
|---|---|---|---|
| Li | <0.005 | Ag | <0.02 |
| Be | <0.005 | Cd | <0.05 |
| B | <0.01 | In | <0.05 |
| F | <0.05 | Sn | <0.05 |
| Na | <0.01 | Sb | <0.05 |
| Mg | <0.01 | Te | <0.05 |
| Al | 0.37 | I | <0.01 |
| Si | 0.93 | Cs | <0.01 |
| P | <0.01 | Ba | <0.005 |
| S | 8.33 | La | <0.005 |
| Cl | 0.12 | Ce | <0.005 |
| K | <0.01 | Pr | <0.005 |
| Ca | <0.2 | Nd | <0.005 |
| Sc | <0.05 | Sm | <0.005 |
| Ti | Matrix | Eu | <0.005 |
| V | 0.18 | Gd | <0.005 |
| Cr | 8.37 | Tb | <0.005 |
| Mn | 0.09 | Dy | <0.005 |
| Fe | 0.34 | Ho | <0.005 |
| Co | <0.005 | Er | <0.005 |
| Ni | 0.2 | Tm | <0.005 |
| Cu | 0.67 | Yb | <0.005 |
| Zn | <0.05 | Lu | <0.005 |
| Ga | <0.05 | Hf | 0.1 |
| Ge | <0.05 | Ta | <5 |
| As | <0.01 | W | <0.01 |
| Se | <0.05 | Re | <0.01 |
| Br | <0.05 | Os | <0.01 |
| Rb | <5 | Ir | <0.01 |
| Sr | <3000 | Pt | <0.05 |
| Y | <200 | Au | <0.05 |
| Zr | 0.42 | Hg | <0.1 |
| Nb | <0.2 | Tl | <0.01 |
| Mo | <0.05 | Pb | <0.01 |
| Ru | <0.01 | Bi | <0.01 |
| Rh | <0.05 | Th | <0.0001 |
| Pd | <0.01 | U | <0.0001 |

(Transition of average crystal grain size in Examples 1 to 5 and Comparative Examples 1 and 2)

As shown in Table 1, although Examples 1 to 5 slightly coarsened at the stage of being heated to 550° C., there was hardly any change. Even when heated at 700° C., the maximum coarsening was up to 50 μm, and no coarsening that exceeded 70 μm could be observed.

Meanwhile, although Comparative Example 1 had fine crystals of 20 μm or less during the target preparation, it coarsened to 30 μm at the stage of being heated to 550° C., and further coarsened to 180 μm when it was heated to 700° C.

Moreover, although Comparative Example 2 had fine crystals of 20 μm or less during the target preparation, it coarsened to 23 μm at the stage of being heated to 550° C., and further coarsened to 110 μm when it was heated to 700° C.

An actual production machine was used to sputter these targets, and the status of particle generation was observed. Examples 1 to 5 showed a slight increase in the generation of particles from the initial stage of sputtering up to an integral power consumption of 400 kWh, but the generation of particles was kept low and hardly fluctuated. Specifically, the generation of particles was effectively inhibited in Examples 1 to 5.

Meanwhile, upon similarly observing the status of particle generation in Comparative Examples 1 and 2, although the generation of particles is kept relatively low from the initial stage of sputtering up to integral power consumption of 150 kWh, unexpected generation of particles were observed at several locations. Subsequently, the generation of particles increased drastically in increasing integral power consumption up to 250 kWh, and the sputtering process also became unstable.

Subsequently, the crystal orientation that appears in the target was examined in respective Examples 1 to 5 and Comparative Examples 1 and 2. The results are shown in Table 4 and Table 5. Table 4 shows the Basal plane orientation ratio, and Table 5 shows the (002) plane orientation ratio.

The Basal plane orientation ratio was calculated based on the formula shown in Table 6, and the (002) orientation ratio was calculated based on the formula shown in Table 7

TABLE 6

$$\langle \text{Crystal Orientation Content Ratio A} \rangle \equiv \frac{\frac{I_{(002)}}{R_{(002)}} + \frac{I_{(103)}}{R_{(103)}} + \frac{I_{(014)}}{R_{(014)}} + \frac{I_{(015)}}{R_{(015)}}}{\sum \frac{I_{(hkl)}}{R_{(hkl)}}}$$

$$\sum \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} + \frac{I_{(110)}}{R_{(110)}} + \frac{I_{(103)}}{R_{(103)}} + \frac{I_{(200)}}{R_{(200)}} +$$
$$\frac{I_{(112)}}{R_{(112)}} + \frac{I_{(201)}}{R_{(201)}} + \frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$
$$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} + \frac{I_{(213)}}{R_{(213)}} + \frac{I_{(302)}}{R_{(302)}}$$

Here, $I_{(hkl)}$ is the peak intensity of the (hkl) plane obtained based on the X-ray diffraction method, and $R_{(hkl)}$ is the relative intensity ratio of the (hkl) plane (refer to JCPDS Card).

TABLE 7

$$\langle \text{Crystal Orientation Content Ratio B} \rangle \equiv \frac{\frac{I_{(002)}}{R_{(002)}}}{\sum \frac{I_{(hkl)}}{R_{(hkl)}}}$$

$$\sum \frac{I_{(hkl)}}{R_{(hkl)}} \equiv \frac{I_{(010)}}{R_{(010)}} + \frac{I_{(002)}}{R_{(002)}} + \frac{I_{(011)}}{R_{(011)}} + \frac{I_{(012)}}{R_{(012)}} + \frac{I_{(110)}}{R_{(110)}} + \frac{I_{(103)}}{R_{(103)}} + \frac{I_{(200)}}{R_{(200)}} +$$
$$\frac{I_{(112)}}{R_{(112)}} + \frac{I_{(201)}}{R_{(201)}} + \frac{I_{(004)}}{R_{(004)}} + \frac{I_{(202)}}{R_{(202)}} + \frac{I_{(014)}}{R_{(014)}} + \frac{I_{(203)}}{R_{(203)}} + \frac{I_{(211)}}{R_{(211)}} +$$

TABLE 4

|  | S amount | Si amount | Orientation ratio during target preparation | Orientation ratio upon heating to 550° C. | Orientation ratio upon heating to 700° C. |
|---|---|---|---|---|---|
| Example 1 | 3 | 3 | 75 | 76 | 79 |
| Example 2 | 5 | 2 | 71 | 70 | 74 |
| Example 3 | 7 | 1 | 70 | 73 | 69 |
| Example 4 | 10 | 0.5 | 74 | 74 | 75 |
| Comparative Example 1 | 0.5 | 2 | 61 | 71 | 76 |
| Comparative Example 2 | 5 | 0.3 | 62 | 72 | 75 |

GS: (average crystal grain size)
S amount and Si amount respectively show the additive amount (mass ppm).
The orientation ratio shows the Basal orientation ratio (%).

TABLE 5

|  | S amount | Si amount | Orientation ratio during target preparation | Orientation ratio upon heating to 550° C. | Orientation ratio upon heating to 700° C. |
|---|---|---|---|---|---|
| Example 1 | 3 | 3 | 3 | 5 | 1 |
| Example 2 | 5 | 2 | 2 | 1 | 1 |
| Example 3 | 7 | 1 | 3 | 2 | 6 |
| Example 4 | 10 | 0.5 | 1 | 3 | 1 |
| Comparative Example 1 | 0.5 | 2 | 9 | 29 | 65 |
| Comparative Example 2 | 5 | 0.3 | 5 | 18 | 45 |

GS: (average crystal grain size)
S amount and Si amount respectively show the additive amount (mass ppm).
The orientation ratio shows the Basal orientation ratio (%).

TABLE 7-continued $$\frac{I_{(114)}}{R_{(114)}} + \frac{I_{(212)}}{R_{(212)}} + \frac{I_{(015)}}{R_{(015)}} + \frac{I_{(204)}}{R_{(204)}} + \frac{I_{(300)}}{R_{(300)}} + \frac{I_{(213)}}{R_{(213)}} + \frac{I_{(302)}}{R_{(302)}}$$

Here, $I_{(hk1)}$ is the peak intensity of the (hk1) plane obtained based on the X-ray diffraction method, and $R_{(hk1)}$ is the relative intensity ratio of the (hk1) plane (refer to JCPDS Card).

As shown in Table 4, with respect to the Basal plane orientation ratio, Examples 1 to 5 were within the range of 70 to 76% when heated to 550° C. and within the range of 69 to 79% when heated to 700° C., and did not fluctuate significantly.

Meanwhile, although Comparative Example 1 was in the range of 61% during the target preparation, it became 71% when heated to 550° C. and considerably increased to 76% when heated to 700° C., and the Basal plane orientation ratio increased.

Moreover, although Comparative Example 2 was in the range of 62% during the target preparation, it became 72% when heated to 550° C. and considerably increased to 75% when heated to 700° C., and the Basal plane orientation ratio increased.

As evident from the above, it has been confirmed that the Examples show a smaller change in the Basal plane orientation ratio in comparison to the Comparative Examples.

As shown in Table 5, with respect to the (002) plane orientation ratio, Examples 1 to 5 were within the range of 1 to 5% when heated to 550° C. and within the range of 1 to 6% when heated to 700° C., and did not fluctuate significantly.

Meanwhile, although Comparative Example 1 was in the range of 9% during the target preparation, it became 29% when heated to 550° C. and considerably increased to 65% when heated to 700° C., and the (002) plane orientation ratio increased considerably.

Moreover, although Comparative Example 2 was in the range of 5% during the target preparation, it became 18% when heated to 550° C. and considerably increased to 45% when heated to 700° C., and the (002) plane orientation ratio increased considerably.

As evident from the above, it has been confirmed that the Examples show a smaller change in the (002) plane orientation ratio in comparison to the Comparative Examples.

Subsequently, the maximum yield stress and elongation of the various Ti targets of foregoing Examples 1 to 5 and Comparative Examples 1 and 2 when the average crystal grain size of the present invention is in the range of 7 to 10 μm, as well as the maximum yield stress and elongation upon receiving the thermal effect of the present invention are shown in Table 8.

In addition, the maximum yield stress and elongation of the various Ti targets of foregoing Examples 1 to 5 and Comparative Examples 1 and 2 when the average crystal grain size of the present invention is in the range of 50 to 60 μm, as well as the maximum yield stress and elongation upon receiving the thermal effect of the present invention are shown in Table 9.

TABLE 8

|  | S amount | Si amount | GS of target | Maximum yield stress (g/mm²) | Elongation (%) |
|---|---|---|---|---|---|
| Example 1 | 3 | 3 | 6 | 23 | 10 |
| Example 2 | 5 | 2 | 5 | 24 | 11 |
| Example 3 | 7 | 1 | 5 | 22 | 10 |
| Example 4 | 10 | 0.5 | 5 | 23 | 9 |

TABLE 8-continued

|  | S amount | Si amount | GS of target | Maximum yield stress (g/mm²) | Elongation (%) |
|---|---|---|---|---|---|
| Comparative Example 1 | 0.5 | 2 | 8 | 25 | 6 |
| Comparative Example 2 | 5 | 0.3 | 8 | 25 | 7 |

GS: (average crystal grain size)
S amount and Si amount respectively show the additive amount (mass ppm).
The average crystal grain size of the target is within the range of 7 to 10 μm.

TABLE 9

|  | S amount | Si amount | GS of target | Maximum yield stress (g/mm²) | Elongation (%) |
|---|---|---|---|---|---|
| Example 1 | 3 | 3 | 45 | 18 | 18 |
| Example 2 | 5 | 2 | 50 | 19 | 18 |
| Example 3 | 7 | 1 | 44 | 20 | 16 |
| Example 4 | 10 | 0.5 | 48 | 18 | 19 |
| Comparative Example 1 | 0.5 | 2 | 180 | 18 | 10 |
| Comparative Example 2 | 5 | 0.3 | 110 | 18 | 12 |

GS: (average crystal grain size)
S amount and Si amount respectively show the additive amount (mass ppm).
The average crystal grain size of the target is within the range of 50 to 60 μm.

As shown in Table 8 and Table 9, the present invention has a high maximum yield stress, but it will not vary considerably with the additive element. The same applies to Comparative Examples 1 and 2.

Nevertheless, as evident from Table 8 and Table 9, while the elongation was small in Comparative Examples 1 and 2, considerable improvement in the elongation was acknowledged in Examples 1 to 4.

In particular, with the grain size in the range of 50 to 60 μm as a result of being heated to the vicinity of 700° C., there was no significant difference in the change of the maximum yield stress in the Examples and the Comparative Examples. However, with respect to elongation, whereas the elongation was 10% in Comparative Example 1 and 12% in Comparative Example 2, the elongation was 16 to 18% in Examples 1 to 4, which was considerable improvement. This has a considerable effect in preventing the target from cracking.

Accordingly, as with the present invention, a titanium target for sputtering containing, as additive components, 3 to 10 mass ppm of S and 0.5 to 3 mass ppm of Si, and in which the purity of the target excluding additive components and gas components is 99.995 mass percent or higher is free from the generation of fractures and cracks, and yields a significant effect of effectively inhibiting the generation of particles upon deposition.

INDUSTRIAL APPLICABILITY

Since the present invention is able to provide a high quality titanium target for sputtering capable of reducing the impurities that cause generation of particles and abnormal discharge, which is free from fractures and cracks during high power sputtering (high rate sputtering), and capable of stabilizing the sputtering properties and effectively suppressing the generation of particles upon deposition, the present invention is useful in forming thin films for electronic devices and the like.

We claim:

1. A high purity titanium target for sputtering containing, as additive components, 3 to 10 mass ppm of S and 0.5 to 3 mass ppm of Si, and in which the purity of the target excluding additive components and gas components is 99.995 mass percent or higher for titanium.

2. The titanium target for sputtering according to claim 1, wherein the purity of the target excluding additive components and gas components is 99.999 mass percent or higher.

3. The titanium target for sputtering according to claim 2, wherein an average crystal grain size of the target is 20 μm or less.

4. The titanium target for sputtering according to claim 2, wherein an average crystal grain size of the target prior to performing sputtering is 20 μm or less, and the average crystal grain size after starting the sputtering process is 70 μm or less.

5. The titanium target for sputtering according to claim 1, wherein an average crystal grain size of the target is 20 μm or less.

6. The titanium target for sputtering according to claim 1, wherein an average crystal grain size of the target prior to performing sputtering is 20 μm or less, and the average crystal grain size after starting the sputtering process is 70 μm or less.

7. A sputtering target consisting of titanium, 3 to 10 mass ppm of S and 0.5 to 3 mass ppm of Si.

8. The sputtering target according to claim 7, wherein an average crystal grain size of the target is 20 μm or less.

9. The sputtering target according to claim 7, wherein an average crystal grain size of the target prior to sputtering is 20 μm or less and the average crystal grain size after being heated as a result of sputtering is 70 μm or less.

* * * * *